United States Patent
Song et al.

(10) Patent No.: US 9,933,455 B2
(45) Date of Patent: Apr. 3, 2018

(54) KNOWN GOOD DIE TESTING FOR HIGH FREQUENCY APPLICATIONS

(71) Applicant: QUALCOMM Incorporated, San Diego, CA (US)

(72) Inventors: Young Kyu Song, San Diego, CA (US); Kyu-Pyung Hwang, Newton, MA (US)

(73) Assignee: QUALCOMM Incorporated, San Diego, CA (US)

( * ) Notice: Subject to any disclaimer, the term of this patent is extended or adjusted under 35 U.S.C. 154(b) by 144 days.

(21) Appl. No.: 14/703,677

(22) Filed: May 4, 2015

(65) Prior Publication Data
US 2016/0327590 A1    Nov. 10, 2016

(51) Int. Cl.
*G01R 1/04* (2006.01)
*G01R 1/073* (2006.01)
*G01R 31/28* (2006.01)
G01R 29/08 (2006.01)
G01R 1/067 (2006.01)

(52) U.S. Cl.
CPC ......... *G01R 1/045* (2013.01); *G01R 1/07314* (2013.01); *G01R 31/2822* (2013.01); *G01R 1/06722* (2013.01); *G01R 1/06772* (2013.01); *G01R 29/08* (2013.01)

(58) Field of Classification Search
USPC .................................. 324/755.05, 756.02
See application file for complete search history.

(56) References Cited

U.S. PATENT DOCUMENTS

| | | | |
|---|---|---|---|
| 4,164,704 A | 8/1979 | Baverstock et al. | |
| 6,034,532 A | 3/2000 | Tarzwell | |
| 6,570,399 B2 | 5/2003 | Yeghiayan et al. | |
| 6,652,326 B2 | 11/2003 | Boyle et al. | |
| 8,102,184 B2 | 1/2012 | Sherry et al. | |
| 2004/0061513 A1* | 4/2004 | Sweet ................ | G01R 1/06772 324/755.05 |
| 2009/0230983 A1* | 9/2009 | Yoshida ............... | G01R 1/0466 324/756.02 |
| 2011/0221464 A1* | 9/2011 | Nagata ................. | G01R 1/0483 324/755.05 |

\* cited by examiner

*Primary Examiner* — Vincent Q Nguyen
(74) *Attorney, Agent, or Firm* — Loza & Loza LLP

(57) ABSTRACT

Embodiments contained in the disclosure provide a method and apparatus for testing an electronic device. An electronic device is installed in a test socket guide. A pusher tip applies a load to the guided coaxial spring probes and forces contact with pads on the device. Test and ground signals are routed through the device and test socket. The apparatus includes a socket having at least one guided coaxial spring probe pin. A socket guide shim is positioned between the receptacle for the electronic device and the socket. A socket guide aids positioning. A pusher tip is placed on the side opposite that of the guided coaxial spring probe pins. The pusher tip mates with a pusher shim and the pusher spring. A top is then placed on the assembly and acts to compress the pusher spring and engage the guided coaxial spring probe pins with the pads on the device.

6 Claims, 10 Drawing Sheets

KNOWN GOOD DIE TESTING FOR HIGH FREQUENCY APPLICATIONS

FIELD

The present disclosure relates generally to wireless communication systems, and more particularly to a method and apparatus for testing secure radio frequency (RF) specifications such as gain, isolation, harmonics, linearity, noise and insertion loss for test socket and probe card applications.

BACKGROUND

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

All wireless devices contain electronic chips which contain modems for transmitting and receiving, and may also contain additional processing functions and memories to support the multiple modes and functions of a smart phone. All of these features must be tested before the phone is delivered to a customer. As chips or system-on-chip (SoC) devices have gained functionality, the devices have become much more complex, with multiple cores and smaller and smaller devices and pins within one SoC. Testing such SoCs has become more difficult, as probing accurately requires a very small probe. In particular, it is difficult to get accurate measurements for critical specifications such as gain, isolation, harmonics, linearity, noise, and insertion loss due to high parasitic inductance.

There is a need in the art for a spring probe that adopts a guided transmission line concept which provides improved signal transition and minimum parasitic inductance at a low cost.

SUMMARY

Embodiments contained in the disclosure provide a method of testing an electronic device. The method begins when an electronic device, such as an SoC, is installed in a test socket guide. The test socket guide forms a part of the spring pin socket and ensures proper positioning of the electronic device to be tested. A pusher tip is then installed on top of the electronic device. The pusher tip applies a load to the guided coaxial spring probes within the socket and acts to push the probes into contact with pads on the device being tested. This contact may be verified by any suitable means. Test and ground signals are then routed through the guided coaxial spring probe pins, with separate nets for signals and ground. Test results may be recorded as the test and ground signals move through the device.

A further embodiment provides an apparatus for testing an electronic device. The apparatus includes a socket having at least one guided coaxial spring probe pin. Sockets may have various numbers of guided coaxial spring probe pins to allow for testing devices of varying sizes and pin/pad counts. A socket guide shim is positioned between the receptacle for the electronic device that will be tested and the socket. A socket guide ensures that the socket is correctly positioned. The electronic device is placed in the receptacle and a pusher tip is placed on the side opposite that of the guided coaxial spring probe pins. The pusher tip mates with a pusher shim and the pusher spring. A top is then placed on the assembly and acts to compress the pusher spring and engage the guided coaxial spring probe pins with the pads on the device.

A still further embodiment provides an apparatus for testing an electronic device. The device includes: means for installing an electronic device to be tested into a test socket guide; means for installing a pusher tip on top of the electronic device installed in the test socket guide; means for verifying that the guided coaxial spring probes within the test socket contact pads on the electronic device; means for routing test signals and ground signals through the guided coaxial spring probe pins on the test socket; and means for recording results of the routing of test signals and ground signals.

DETAILED DESCRIPTION

Figure 1:
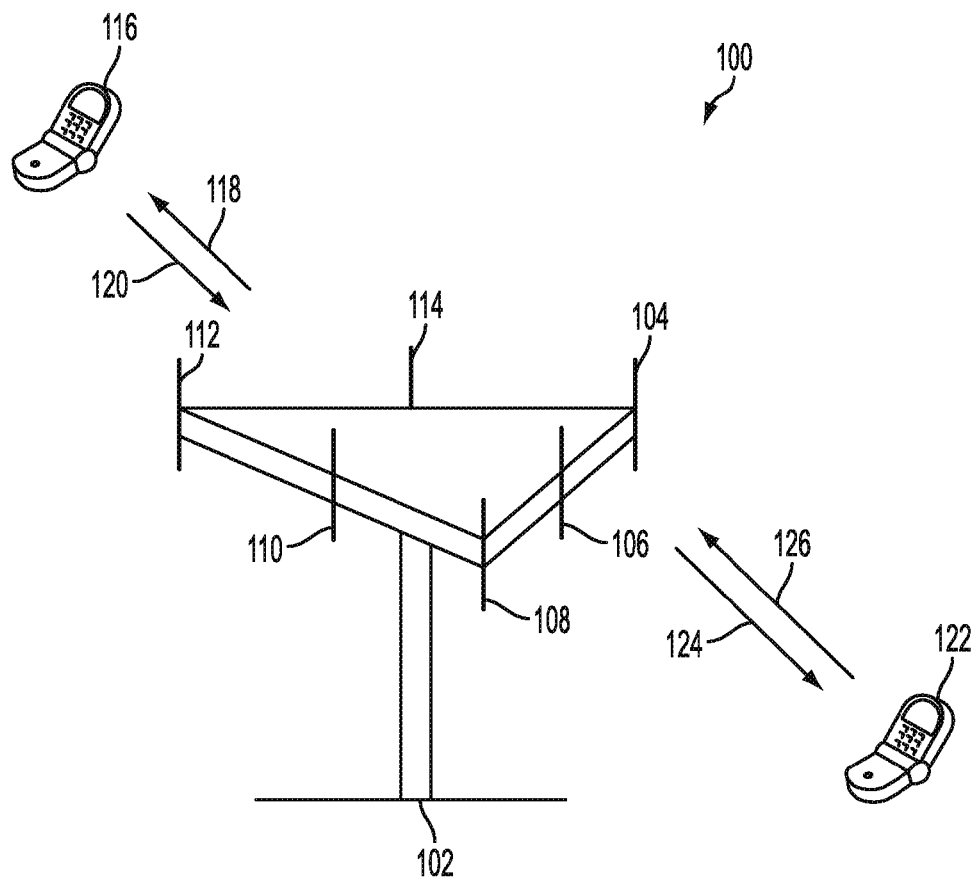
FIG. 1 illustrates a wireless multiple-access communication system, in accordance with certain embodiments of the disclosure.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Furthermore, various aspects are described herein in connection with an access terminal and/or an access point. An access terminal may refer to a device providing voice and/or data connectivity to a user. An access wireless terminal may be connected to a computing device such as a laptop computer or desktop computer, or it may be a self-contained device such as a cellular telephone. An access terminal can also be called a system, a subscriber unit, a subscriber station, mobile station, mobile, remote station, remote terminal, a wireless access point, wireless terminal, user terminal, user agent, user device, or user equipment. A wireless terminal may be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. An access point, otherwise referred to as a base station or base station controller (BSC), may refer to a device in an access network that communicates over the air-interface, through one or more sectors, with wireless terminals. The access point may act as a router between the wireless terminal and the rest of the access network, which may include an Internet Protocol (IP) network, by converting received air-interface frames to IP packets. The access point also coordinates management of attributes for the air interface.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

FIG. 1 illustrates a multiple access wireless communication system 100 according to one aspect. An access point 102 (AP) includes multiple antenna groups, one including 104 and 106, another including 108 and 110, and an additional one including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over downlink or forward link 118 and receive information from access terminal 116 over uplink or reverse link 120. Access terminal 122 is in communication with antennas 106 and 108, where antennas 106 and 108 transmit information to access terminal 122 over downlink or forward link 124, and receive information from access terminal 122 over uplink or reverse link 126. In a frequency division duplex (FDD) system, communication link 118, 120, 124, and 126 may use a different frequency for communication. For example, downlink or forward link 118 may use a different frequency than that used by uplink or reverse link 120.

Each group of antennas and/or the area in which they are designed to communicate is often referred to as a sector of the access point. In an aspect, antenna groups are each designed to communicate to access terminals in a sector of the areas covered by access point 102.

In communication over downlinks or forward links 118 and 124, the transmitting antennas of an access point utilize beamforming in order to improve the signal-to-noise ration (SNR) of downlinks or forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, an evolved Node B (eNB), or some other terminology. An access terminal may also be called a mobile station, user equipment (UE), a wireless communication device, terminal or some other terminology. For certain aspects, either the AP 102, or the access terminals 116, 122 may utilize the techniques described below to improve performance of the system.

Figure 2:
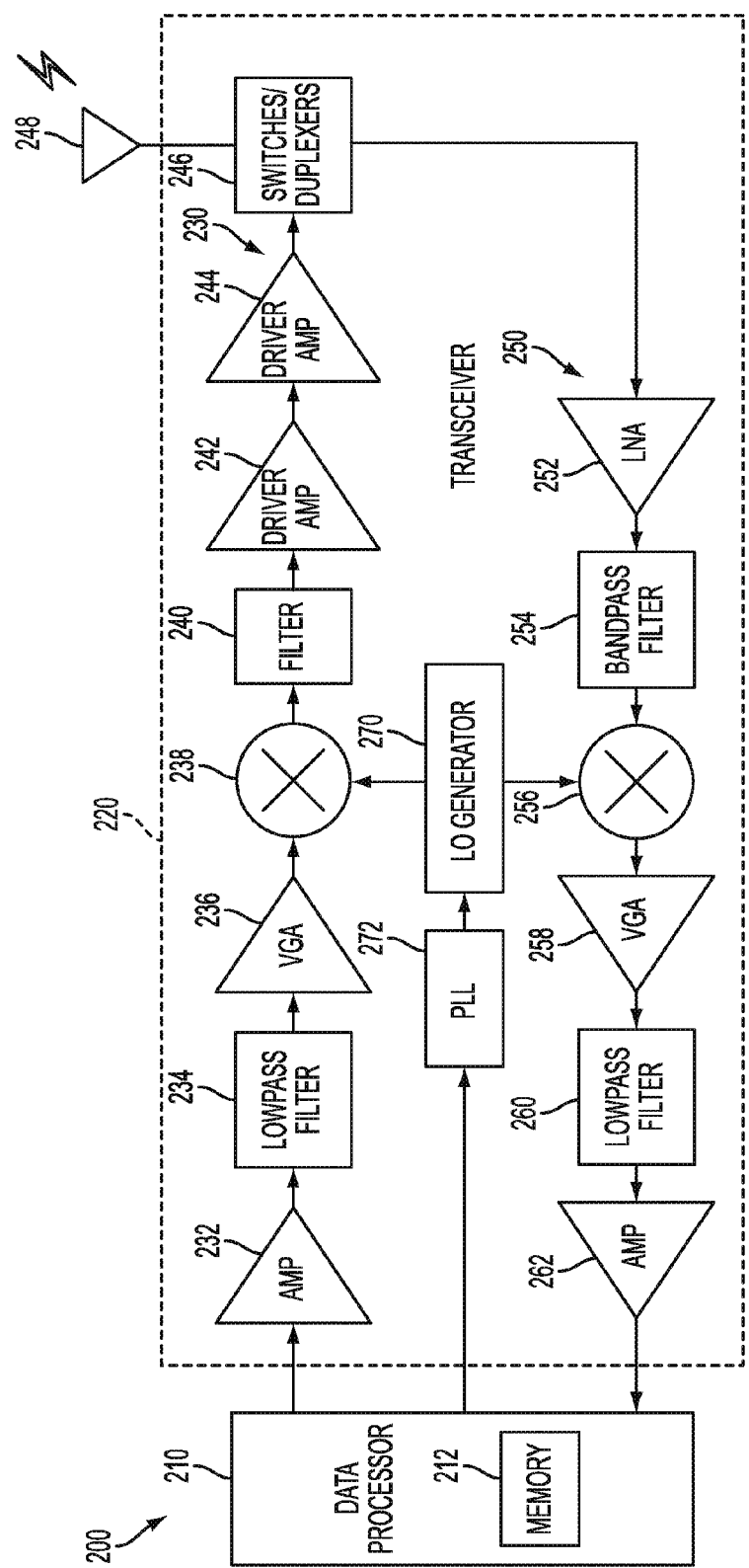
FIG. 2 is a block diagram of a wireless communication system in accordance with embodiments of the disclosure.

FIG. 2 shows a block diagram of an exemplary design of a wireless communication device 200. In this exemplary design, wireless device 200 includes a data processor 210 and a transceiver 220. Transceiver 220 includes a transmitter 230 and a receiver 250 that support bi-directional wireless communication. In general, wireless device 200 may include any number of transmitters and any number of receivers for any number of communication systems and any number of frequency bands.

In the transmit path, data processor 210 processes data to be transmitted and provides an analog output signal to transmitter 230. Within transmitter 230, the analog output signal is amplified by an amplifier (Amp) 232, filtered by a lowpass filter 234 to remove images caused by digital-to-analog conversion, amplified by a VGA 236, and upconverted from baseband to RF by a mixer 238. The upconverted signal is filtered by a filter 240, further amplified by a driver amplifier, 242 and a power amplifier 244, routed through switches/duplexers 246, and transmitted via an antenna 249.

In the receive path, antenna 248 receives signals from base stations and/or other transmitter stations and provides a received signal, which is routed through switches/duplexers 246 and provided to receiver 250. Within receiver 250, the received signal is amplified by an LNA 252, filtered by a bandpass filter 254, and downconverted from RF to baseband by a mixer 256. The downconverted signal is amplified by a VGA 258, filtered by a lowpass filter 260, and amplified by an amplifier 262 to obtain an analog input signal, which is provided to data processor 210.

FIG. 2 shows transmitter 230 and receiver 250 implementing a direct-conversion architecture, which frequency converts a signal between RF and baseband in one stage. Transmitter 230 and/or receiver 250 may also implement a super-heterodyne architecture, which frequency converts a signal between RF and baseband in multiple stages. A local oscillator (LO) generator 270 generates and provides transmit and receive LO signals to mixers 238 and 256, respectively. A phase locked loop (PLL) 272 receives control information from data processor 210 and provides control signals to LO generator 270 to generate the transmit and receive LO signals at the proper frequencies.

FIG. 2 shows an exemplary transceiver design. In general, the conditioning of the signals in transmitter 230 and receiver 250 may be performed by one or more stages of amplifier, filter, mixer, etc. These circuits may be arranged differently from the configuration shown in FIG. 2. Some circuits in FIG. 2 may also be omitted. All or a portion of transceiver 220 may be implemented on one or more analog integrated circuits (ICs), RF ICs (RFICs), mixed-signal ICs, etc. For example, amplifier 232 through power amplifier 244 in transmitter 230 may also be implemented on an RFIC. Driver amplifier 242 and power amplifier 244 may also be implemented on another IC external to the RFIC.

Data processor 210 may perform various functions for wireless device 200, e.g., processing for transmitter and received data. Memory 212 may store program codes and data for data processor 210. Data processor 210 may be implemented on one or more application specific integrated circuits (ASICs) and/or other ICs.

Mobile devices, such as those described in FIG. 2 rely on processors to perform many of the functions desired by users. As mobile devices perform more functions, the demands on the processors have escalated and processor complexity has increased. Many mobile devices use a single chip, known as a System-on-a-Chip (SoC) to perform the majority of tasks, including running applications. An advanced modem is a key part of the SoC. Testing such high frequency application is critical and requires accurate measurement and testing of radio frequency (RF) specifications including gain, isolation, harmonics, linearity, noise, and insertion loss for both test socket and probe card applications.

One solution that has been used is membrane probing. Membrane probing has a higher contact resistance and lower direct current (DC) for wafers. An advantage is the lower parasitic inductance of the membrane probe head. Wafers contain multiple SoC devices and may be tested before the individual devices are separated. Unfortunately, membrane probing requires mounting a costly membrane probe head and the design of the membrane probe head is also high. Each SoC wafer requires a specially designed membrane probe head. Because membrane probe heads provide higher contact resistance a duty cycle is required, which increases testing time.

An alternative to the membrane probe head is the spring probe. Spring probes are capable of handling higher DC currents than membrane probe heads. In addition, spring probes have lower contact resistance. However, spring probes also have the drawback of having larger parasitic inductance, which may create inaccurate measurements of gain, isolation, harmonics, linearity, noise, and insertion loss.

Figure 3:
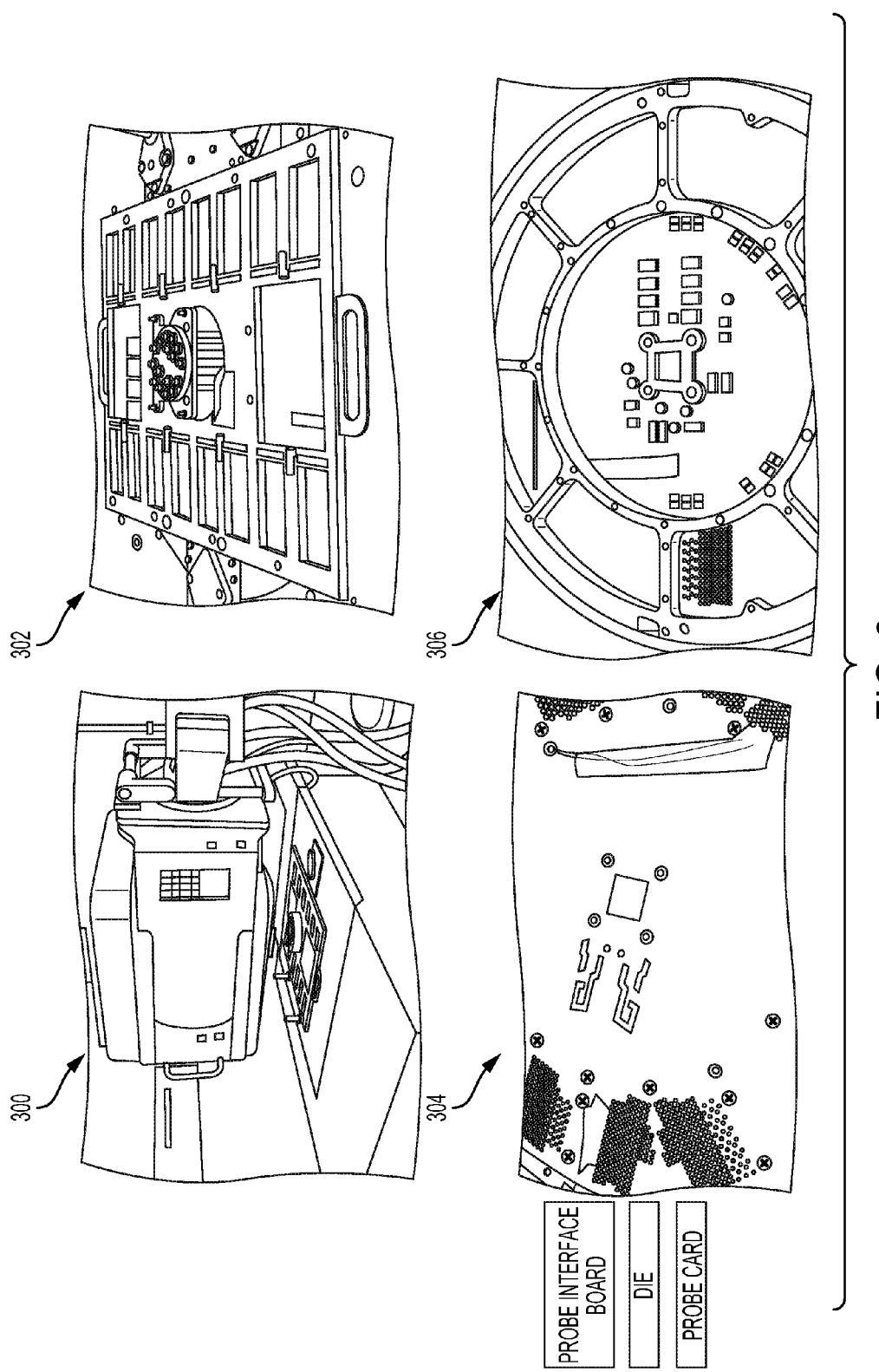
FIG. 3 depicts multiple views of a probe interface board and probe assembly in accordance with embodiments of the disclosure.

FIG. 3 illustrates a typical test set-up. The test assembly 300 includes a probe interface board 302. A probe card 304 is placed on one side of the probe interface board 302. A core is placed on probe card 304 and a testing probe has access to the die during testing.

Figure 4:
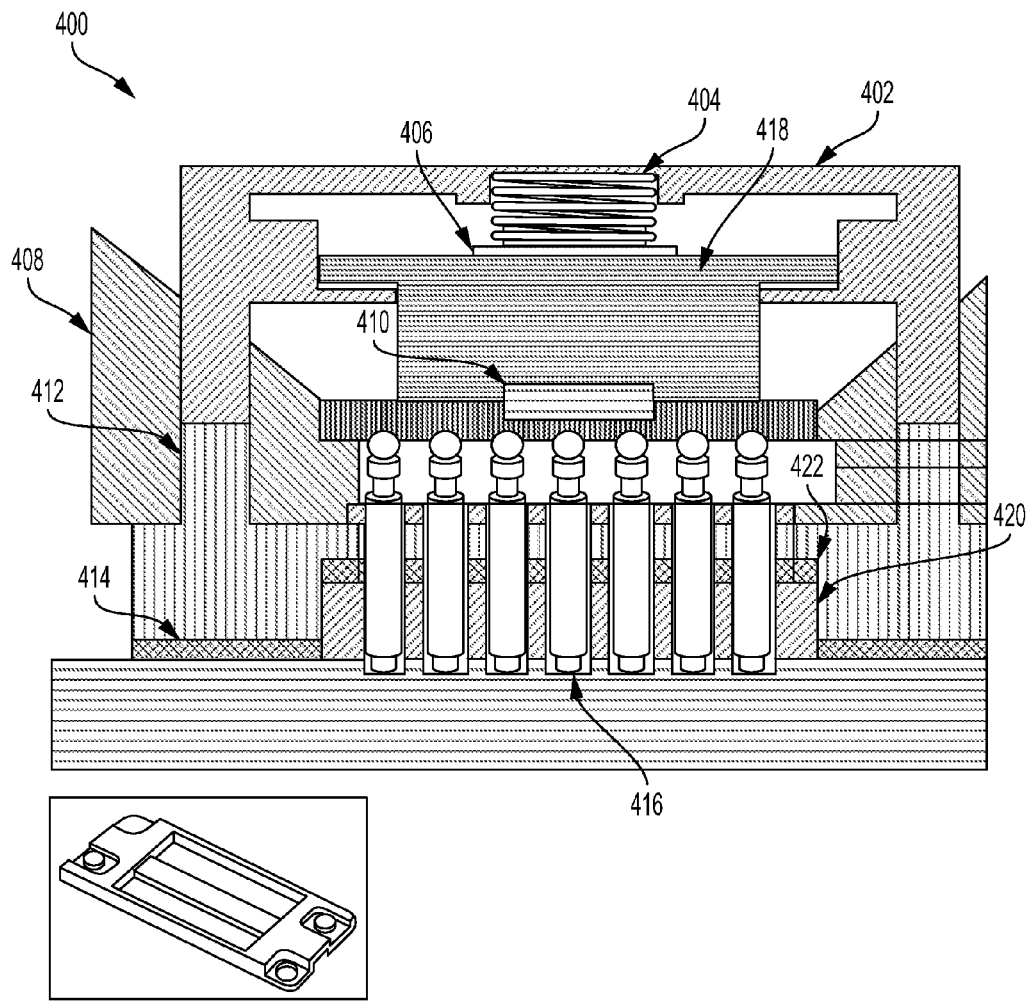
FIG. 4 illustrates use of a guided coaxial spring probe socket in accordance with embodiments of the disclosure.

FIG. 4 shows a cut-away view of a guided coaxial spring probe socket in use. The assembly 400 includes a top 402 and a pusher or retention spring 404. Retention spring 404 helps maintain engagement between the pu into insert 408 sher tip 418 and top 402. A pusher shim 406 ensures good contact between pusher tip 418 and top 402 and also allows for adjustments. Top 402 fits into insert 408, which also hold the device being tested 410. Device 410 is placed into socket 420 and socket shim 422 assures correct fit and placement. Socket guide 412 acts in conjunction with socket guide shim 414 and insert 408 to retain device 410 in position for testing. During testing pins 416 make contact with the pads on device 410. This contact is also depicted in FIG. 4, in the accompanying illustration where the compressed and uncompressed states of the guided coaxial spring probes are depicted.

Figure 5:
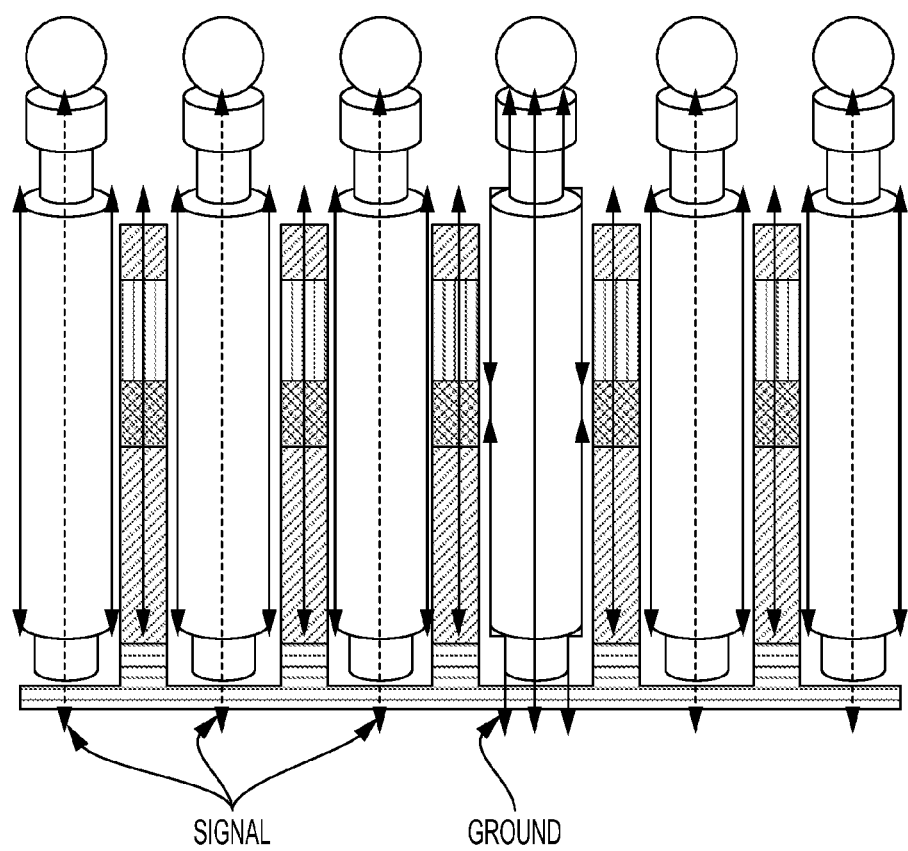
FIG. 5 depicts signal and ground transmission in a guided coaxial spring probe socket in accordance with embodiments of the disclosure.

FIG. 5 shows the signal transmission through the pin 416 to the pad on the device being tested 410. In addition, ground signals are also shown in FIG. 5. This signal transmission occurs during testing. One advantage to the guided coaxial spring probe socket is that it is suitable for use with a convention signal net and ground net.

Figure 6:
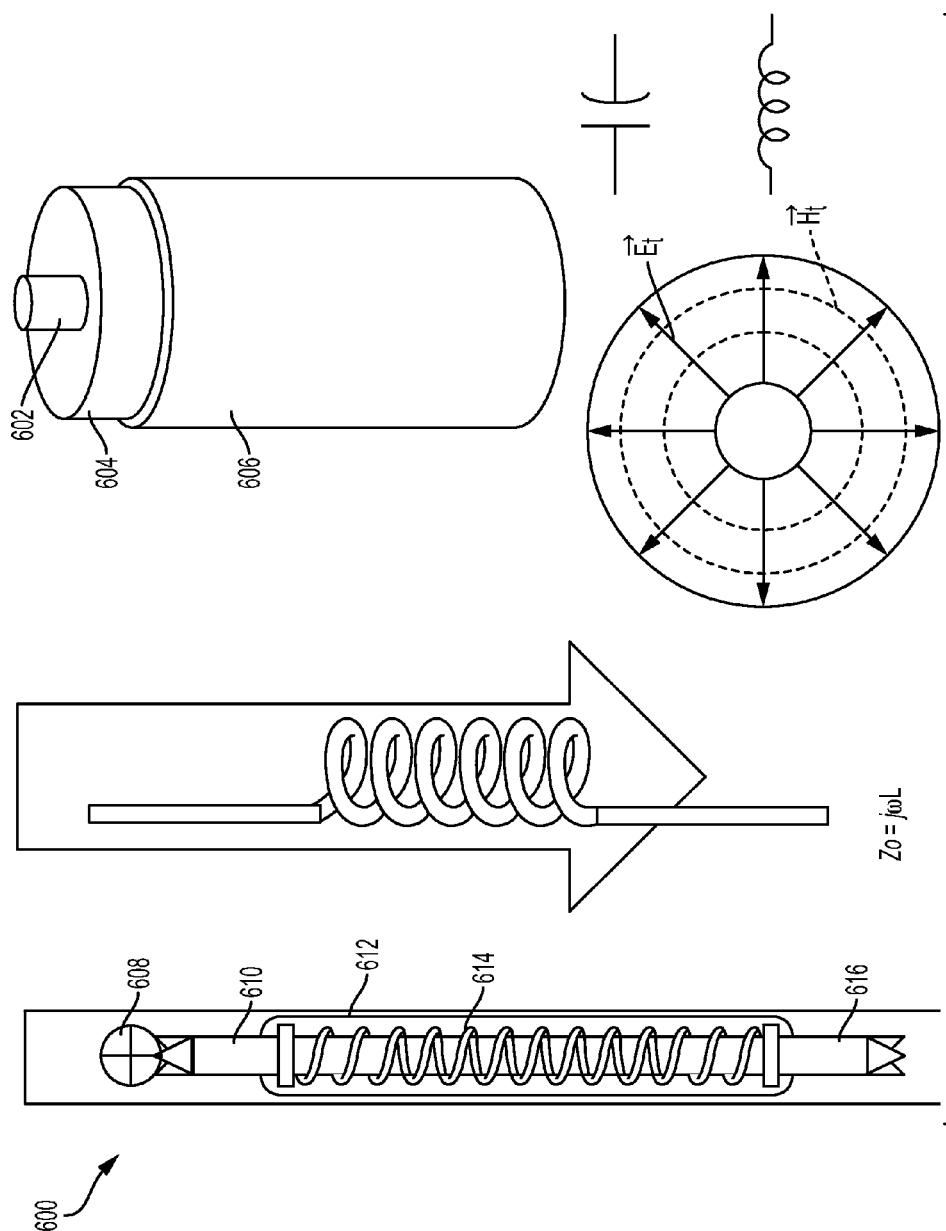
FIG. 6 illustrates construction of a guided coaxial spring probe socket in accordance with embodiments of the disclosure.

FIG. 6 depicts one guided coaxial spring probe assembly 600. Spring probe assembly 600 is one of multiple guided coaxial spring probes forming a testing socket 400 as shown in FIG. 4. Guided coaxial spring probe assembly 600 includes conductor 602, dielectric 604, and shield 605. These components act to transmit signals as shown in the illustration. Signal transmission is provided by solder ball 608 which makes contact with the device 410 pads. Solder ball 608 is placed at one end of probe head 610. Probe head 610 extends from barrel 612. Barrel 612 contains spring 614.

Probe bottoms 616 act as limits on guided coaxial spring probe travel during use. In use, each guided coaxial spring probe behaves as an inductance in series and a capacitor in parallel, as illustrated in FIG. 6. The behavior of guided coaxial spring probe 600 may be approximated to that of a first order approximation wire representation by the formula:

$$Z_O = (L/C)^{1/2}$$

In operation the guided coaxial spring probe pin provides significantly improved RF signal transition and also provides minimum parasitic inductance to solve difficult RF specification measurement issues. The electromagnetic field, guided by the coaxial line minimizes signal loss and impedance matching, moving closer to a perfect transmission line. Current passes through the dielectric inner medium 604 and the outer plated shield 606 to create a coaxial electromagnetic field pattern generated by conductor 602.

Figure 7:
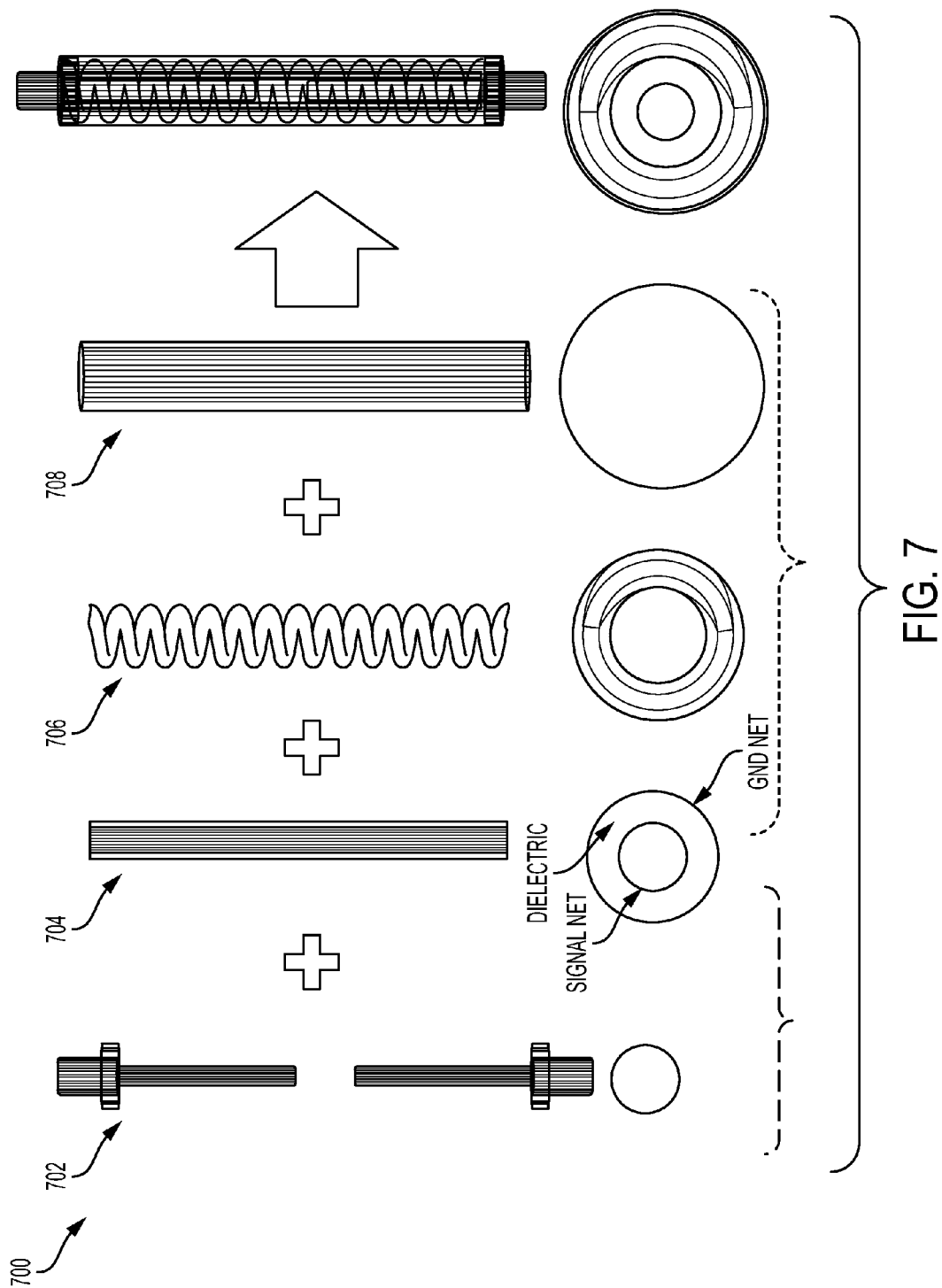
FIG. 7 depicts each component of a guided coaxial spring probe in accordance with embodiments of the disclosure.

FIG. 7 depicts the signal and ground net of each guided coaxial spring probe assembly 700. Conductor 702 resides within dielectric 704. Dielectric 704 is a microtube with an inner surface signal net and an outer surface ground net. Spring 706 contains both conductor 702 and dielectric microtube 704. Barrel 708 contains spring 706, dielectric 704 and conductor 702.

Figure 8:
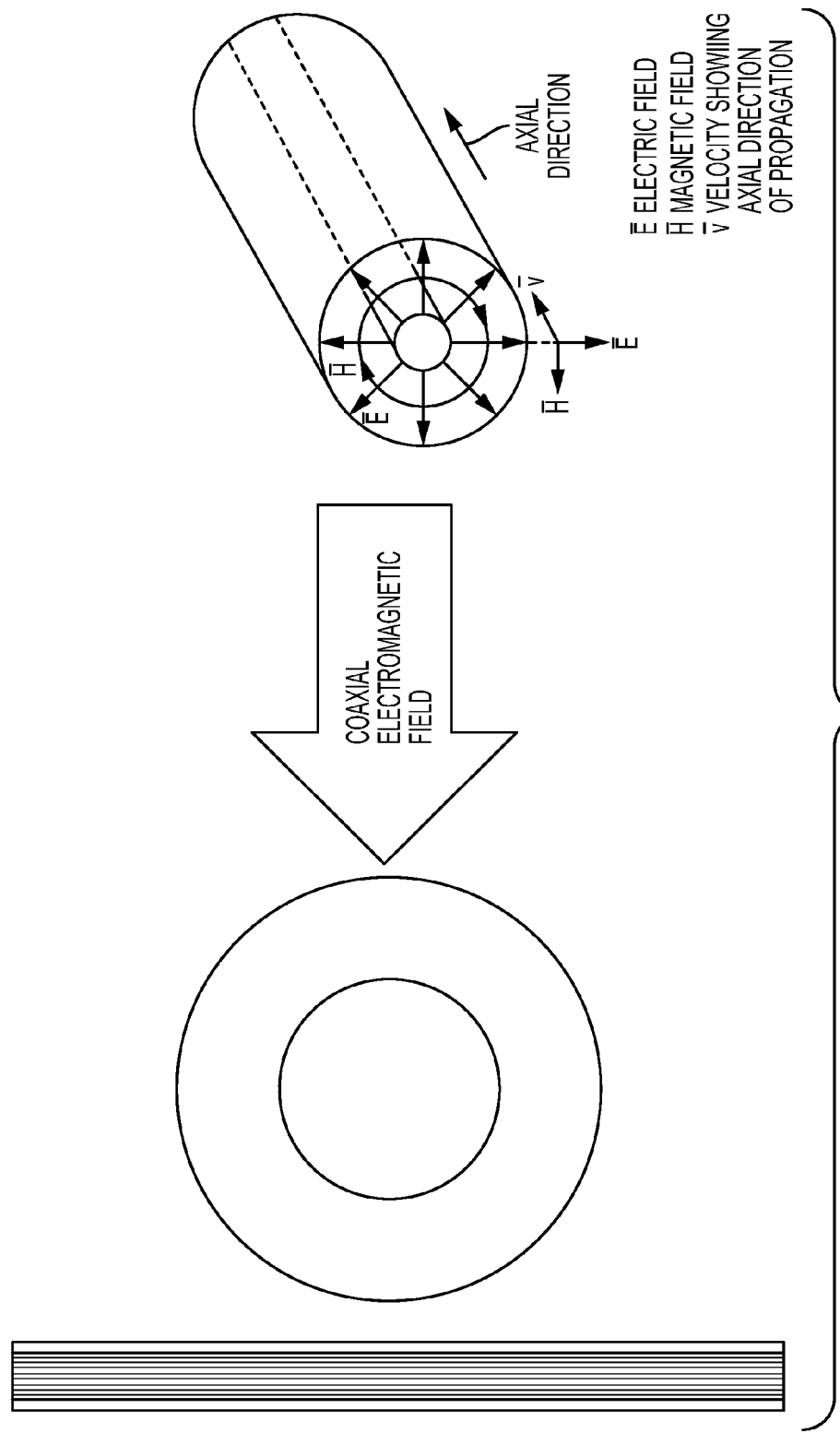
FIG. 8 illustrates signal transmission in a guided coaxial spring probe in accordance with embodiments of the disclosure.

FIG. 8 provides further details of the operation of the inner or signal net and the outer metal or ground net. The electromagnetic field is coaxial, as shown in FIG. 8. The energy propagates in an axial region between the inner or signal net conductor and the outer metal or ground net.

Figure 9:
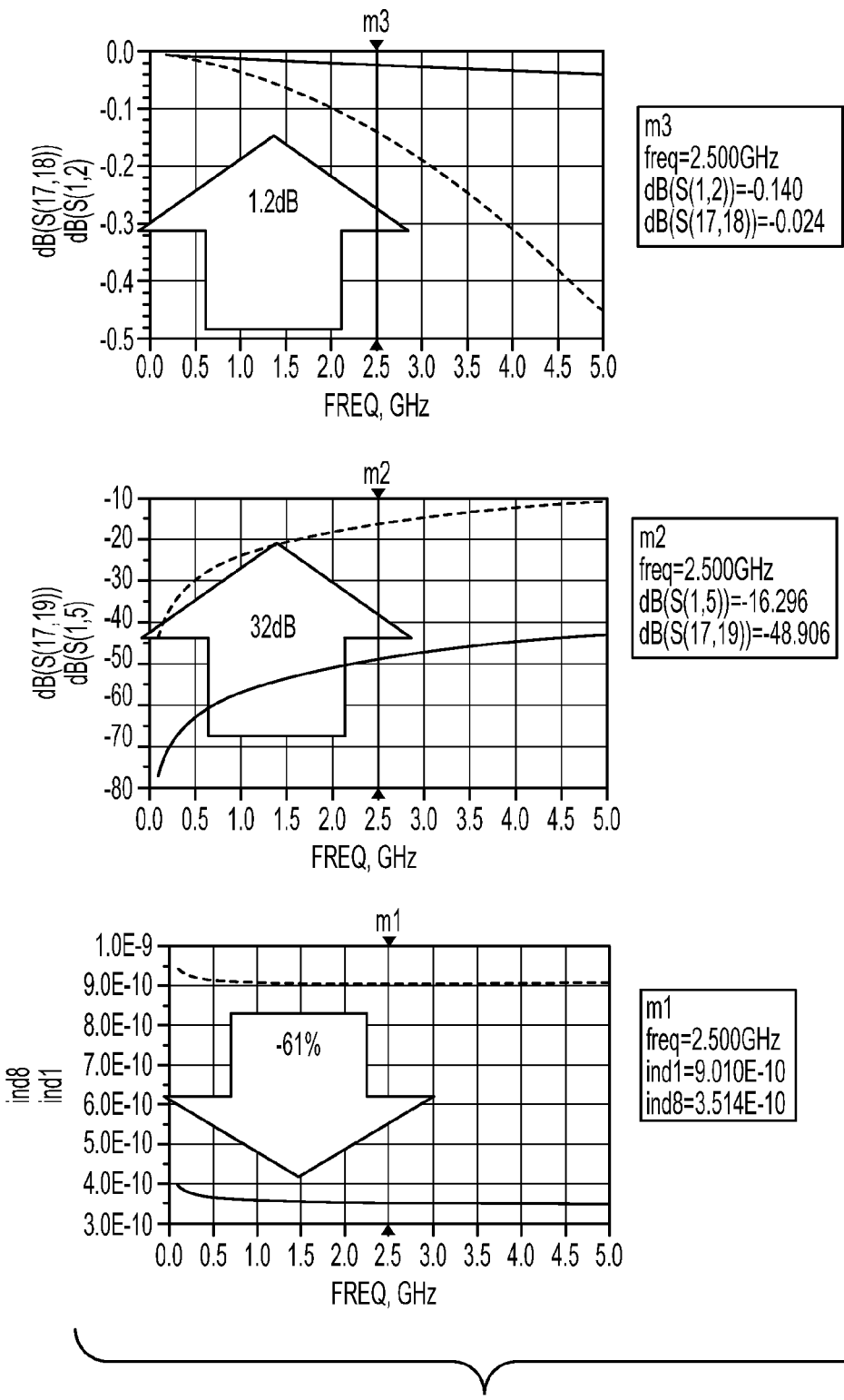
FIG. 9 shows test results using a guided coaxial spring probe in accordance with embodiments of the disclosure.

FIG. 9 shows the improvements possible through use of the guided coaxial spring probe socket described above. Insertion loss on the tested lines was 0.03 dB at 2.5 GHz for the simulation testing. Isolation was also better, with −30 dB improvement, due to better shielding on the guided coaxial spring probe. In addition, parasitic inductance was significantly decrease, with approximately a 60% drop, and a result of 0.35 nH. These simulation results arise because, with the exception of the probe heads, the guided coaxial spring probe may be considered a part of the coaxial transmission line. As a result, isolation and insertion loss are nearly the same as for coaxial transmission lines.

Figure 10:
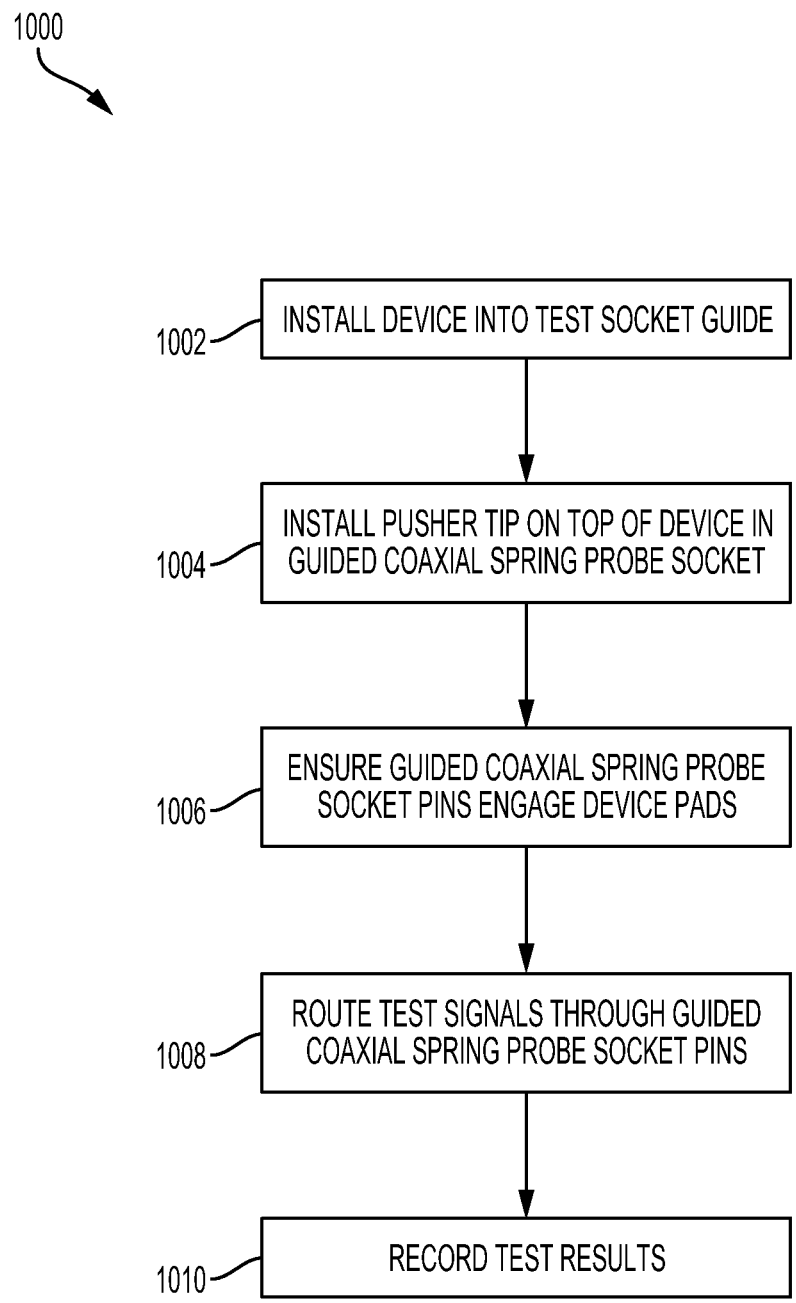
FIG. 10 is a flowchart of a method of testing high frequency applications using a guided coaxial spring probe in accordance with embodiments of the disclosure.

FIG. 10 is a flowchart of a method of testing a device using a guided coaxial spring probe socket. The method 1000 begins in step 1002*v* when the device to be tested is installed into the test socket guide. In step 1004 the pusher tip is installed on top of the device and through a spring pushes down on the device to be tested. A check is made in step 1006 to ensure that the guided coaxial spring probe socket pins engage the device pads. Testing begins when test signals are toured through the guided coaxial spring probe socket pines. Finally, in step 1010 test results are recorded.

The method and apparatus described above provide advantages over current test methodologies. Memory probing requires a 25% duty cycle with cleaning of the probe required in between tests. Using the guided coaxial spring probe described above reduces test time because it provides a greater duty cycle and does not need to be cleaned. A further advantage of the guided coaxial spring probe is that the lower parasitic inductance and contact resistance, along with a larger DC current, allows testing of high power devices without disturbing the loading conditions. A greater benefit is that more accurate measurement and testing of RF specifications such as gain, isolation, harmonics, linearity, noise, and insertion loss are possible, due to the lower parasitic inductance.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers.

Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. An apparatus for testing an electronic device, comprising:
   a socket with at least one guided coaxial spring probe pin, the guided coaxial spring probe pin having a microtube with an inner surface signal net and an outer surface ground net;
   a socket guide shim positioned between a receptacle for an electronic device and the socket with at least one guided coaxial spring probe pin;
   a socket guide mating with the socket guide shim and the socket with at least one guided coaxial spring probe pin;
   a pusher tip mounted opposite to the socket with at least one guided coaxial spring probe pin and mating with the socket guide and an insert;
   a pusher shim placed between the pusher tip and a pusher spring; and
   a top compressing the pusher spring.

2. The apparatus of claim 1, wherein the guided coaxial spring probe pin comprises:
   a solder ball;
   a probe head attached to the solder ball;
   a barrel;
   a spring disposed within the barrel; and
   a probe bottom attached to a socket.

3. The apparatus of claim 2, further comprising:
   a conductor disposed within the barrel; and
   the microtube disposed around the conductor.

4. The apparatus of claim 3, wherein the microtube is disposed within the barrel.

5. The apparatus of claim 3, wherein the microtube is formed of dielectric material.

6. The apparatus of claim 3, wherein the spring routes a ground signal.

* * * * *